(12) United States Patent
Ramos

(10) Patent No.: US 11,387,647 B2
(45) Date of Patent: Jul. 12, 2022

(54) CONTINUOUS CASCODE VOLTAGE CONTROL FOR PROTECTION OF LOW VOLTAGE DEVICES

(71) Applicant: pSemi Corporation, San Diego, CA (US)

(72) Inventor: Carlos Zamarreno Ramos, Seville (ES)

(73) Assignee: PSEMI CORPORATION, San Diego, CA (US)

( * ) Notice: Subject to any disclaimer, the term of this patent is extended or adjusted under 35 U.S.C. 154(b) by 46 days.

(21) Appl. No.: 17/102,304

(22) Filed: Nov. 23, 2020

(65) Prior Publication Data

US 2022/0166215 A1  May 26, 2022

(51) Int. Cl.
*H02H 9/02* (2006.01)
*H02H 9/04* (2006.01)
(Continued)

(52) U.S. Cl.
CPC .............. *H02H 9/025* (2013.01); *H02H 9/04* (2013.01); *H02H 9/046* (2013.01); *H01L 27/02* (2013.01);
(Continued)

(58) Field of Classification Search
CPC .......... H02H 9/00; H02H 9/025; H02H 9/046; H02H 9/04; H02H 9/005; H02H 9/041; H02H 3/20; H01L 27/02; H01L 27/0288
(Continued)

(56) References Cited

U.S. PATENT DOCUMENTS

| 8,779,860 B2 | 7/2014 | Jeon et al. | |
|---|---|---|---|
| 2016/0172850 A1* | 6/2016 | Ellis-Monaghan | .... H02H 9/046 361/56 |

(Continued)

OTHER PUBLICATIONS

Non-Final Office Action for U.S. Appl. No. 16/264,106 dated Apr. 30, 2020, 12 pages.

(Continued)

*Primary Examiner* — Danny Nguyen
(74) *Attorney, Agent, or Firm* — Steinfl + Bruno LLP

(57) ABSTRACT

Methods and apparatuses for protecting a low voltage (LV) circuit implemented with LV transistors are presented. Protection is provided via a protection circuit operating in a high voltage domain defined by a varying supply voltage and a reference ground. The protection circuit generates high side, $V_H$, and low side, $V_L$, voltages to the LV circuit, while protecting the LV circuits from high voltage and maintaining a minimum difference voltage, $V_H-V_L$. The protection circuit generates the difference voltage based on a voltage across a resistor of a resistor ladder that is coupled between the varying supply voltage and the reference ground. The protection circuit includes a clamp circuit that limits the minimum difference voltage for low values of the supply voltage. The protection circuit generates the difference voltage according to a nonlinear transfer function of the supply voltage that includes two linear segments having different slopes and a nonlinear segment that provides a continuous and smooth transition between the two linear segments.

23 Claims, 13 Drawing Sheets

(51) Int. Cl.
  *H02H 9/00* (2006.01)
  *H01L 27/02* (2006.01)
  *H02H 3/20* (2006.01)
(52) U.S. Cl.
  CPC .............. *H02H 3/20* (2013.01); *H02H 9/005* (2013.01); *H02H 9/041* (2013.01)
(58) Field of Classification Search
  USPC .......................................... 361/56, 91.1, 111
  See application file for complete search history.

(56) References Cited

U.S. PATENT DOCUMENTS

2019/0025862 A1*  1/2019  Singh ...................... G06F 1/305
2020/0007088 A1   1/2020  Ranta et al.

OTHER PUBLICATIONS

Non-Final Office Action for U.S. Appl. No. 16/264,106 dated Nov. 27, 2020, 12 pages.

* cited by examiner

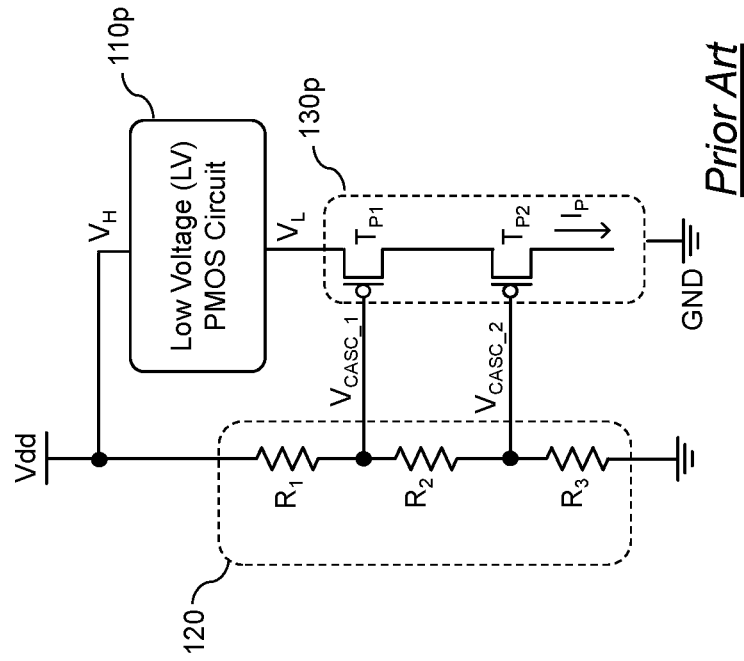
FIG. 1C *Prior Art*
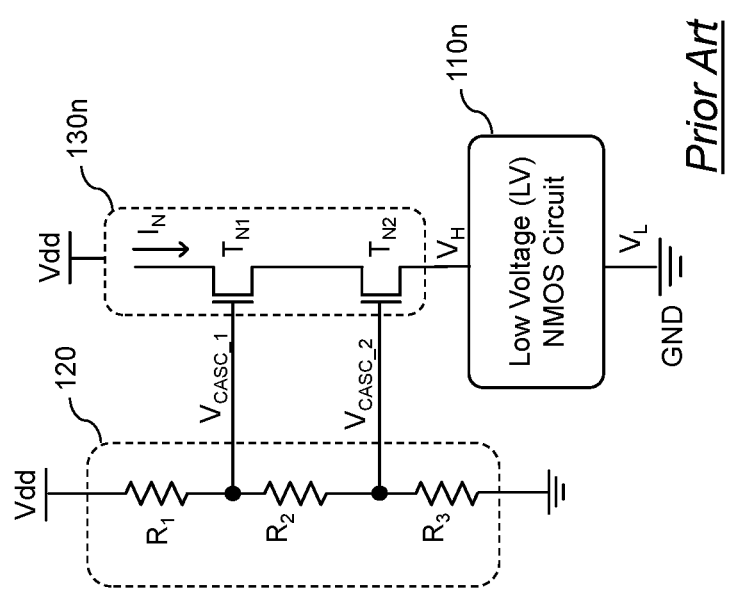
FIG. 1B *Prior Art*

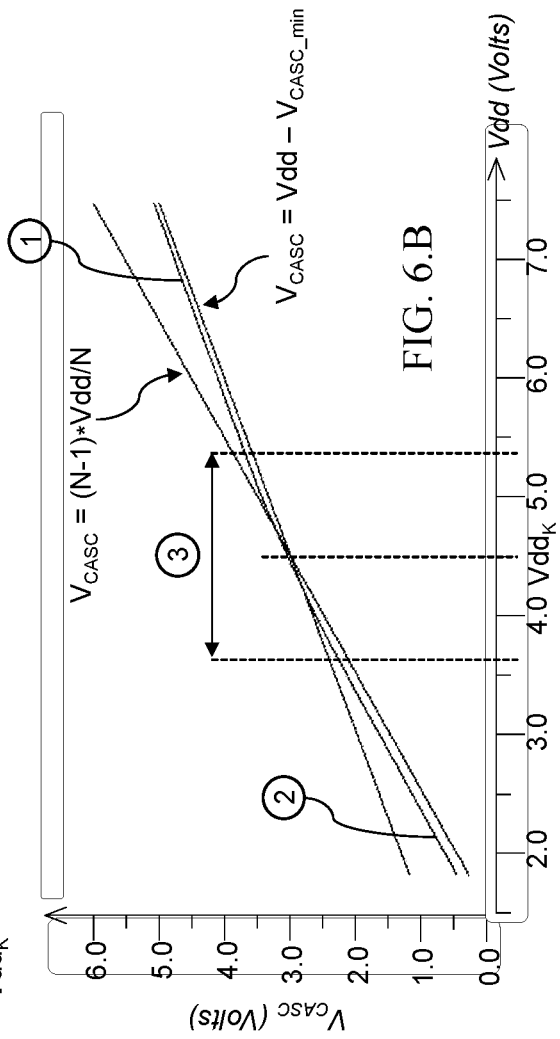
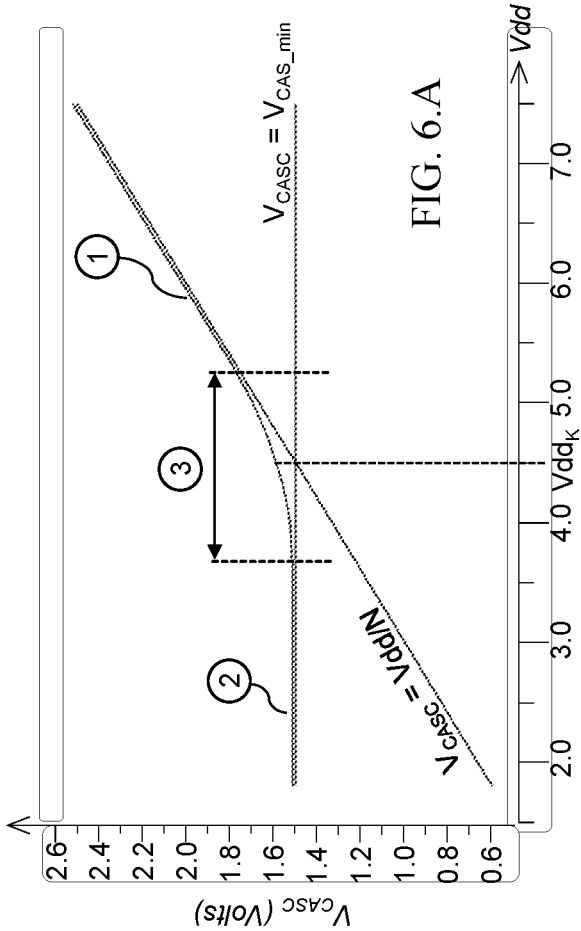
FIG. 6.A
FIG. 6.B

CONTINUOUS CASCODE VOLTAGE CONTROL FOR PROTECTION OF LOW VOLTAGE DEVICES

TECHNICAL FIELD

The present teachings relate to electrical circuits that can be used, for example, in electronic devices. More particularly, the present teachings relate to methods and apparatuses for protecting low voltage (LV) circuits implemented with low voltage (LV) transistors via protection circuit operating in a high voltage domain.

BACKGROUND

FIG. 1A shows a simplified block diagram of a prior art protection circuit (120, 130) used to protect a low voltage (LV) circuit (110). The protection circuit (120, 130) may operate in a high voltage domain that is defined by a variable supply voltage, Vdd, and a reference ground, GND, and generate floating reference voltages ($V_H$, $V_L$) to the LV circuit (110). Accordingly, the LV circuit (110) may operate between a high side (floating) reference voltage, $V_H$, and a low side (floating) reference voltage, $V_L$. The protection circuit (120, 130) generates the floating reference voltages ($V_H$, $V_L$) based on a voltage rating of the LV circuit (110). Such voltage rating may be based on a withstand voltage of one or more LV transistors used to implement the LV circuit (110), such withstand voltage being substantially smaller than the supply voltage, Vdd. In other words, based on the supply voltage, Vdd, referenced to the reference ground, GND, the protection circuit (120, 130) generates a voltage difference, $V_H-V_L$, across the LV circuit (110) for operation of the LV circuit (110), while protecting the one or more LV transistors of the LV circuit (110).

With continued reference to FIG. 1A, the prior art protection circuit (120, 130) may include a resistor ladder circuit (120) implemented via a plurality of series-connected resistors ($R_1, R_2, \ldots, R_N$) and a floating reference generator circuit (130), both circuits (120, 130) coupled between the supply voltage, Vdd, and the reference ground, GND. The resistor ladder circuit (120) may divide the supply voltage, Vdd, at respective nodes of the resistor ladder (120) that are coupled to the floating reference generator circuit (130). In turn, the floating reference generator circuit (130) may generate the floating reference voltages ($V_H$, $V_L$) based on the divided supply voltage, Vdd. For example, the series-connected resistors ($R_1, R_2, \ldots, R_N$) may have a same resistance (i.e., equal resistor values) and therefore may provide a divided voltage, Vdd/N, to the floating reference generator circuit (130), which in turn generates the floating reference voltages ($V_H$, $V_L$) so that the difference, $V_H-V_L$, is equal to the divided voltage, Vdd/N. As can be clearly taken from FIG. 1A, the divided voltage, Vdd/N, may be provided as a voltage across a resistor of the resistor ladder (120). It should be noted that the divided voltage need not be generated with equal resistance resistors ($R_1, R_2, \ldots, R_N$), as unequal resistor values may also be used to generate the divided voltage.

The one or more LV transistors used to implement the LV circuit (110) of FIG. 1A may be of different polarities, for example, such transistors may be NMOS transistors to implement the LV NMOS circuit (110n) shown in FIG. 1B, or the PMOS transistors to implement the LV PMOS circuit (110p) shown in FIG. 1C. Furthermore, the floating reference generator circuit (110) of FIG. 1A may be configured for operation with NMOS transistors as shown in FIG. 1B, or PMOS transistors as shown in FIG. 1C.

With reference to the prior art circuit shown in FIG. 1B, a cascode configuration (130n) is used as the floating reference generator circuit (130) described in FIG. 1A. The cascode configuration (130n) comprises a plurality of series-connected NMOS transistors ($T_{N1}, T_{N2}$) coupled to respective nodes of the resistor ladder circuit (120), each of the respective nodes providing a divided supply voltage, Vdd, such as, for example, a voltage across any resistor of the resistor ladder circuit (120) is equal to Vdd/N (e.g., N=3 for the exemplary case of FIG. 1B). In other words, the resistor ladder circuit (120) provides gate voltages ($V_{CASC\_1}$, $V_{CASC\_2}$) to gates of the cascode transistors ($T_{N1}, T_{N2}$) which in turn provide the floating reference voltages ($V_H$, $V_L$) to the LV NMOS circuit (110n). In particular, for the case of the LV NMOS circuit (110n) shown in FIG. 1B, the cascode configuration (130n) is coupled, on the high side, to the supply voltage, Vdd, and on the low side, to the LV NMOS circuit (110n), so to provide the high side reference voltage, $V_H$. Furthermore, the low side reference voltage, $V_L$, is coupled to the reference ground, GND. Accordingly, a demand current, $I_N$, may flow from the supply voltage, Vdd, to the reference ground, GND, through the cascode configuration (130n) and through the LV NMOS circuit (110n). Such demand current, $I_N$, may be responsive to operation requirements of the LV NMOS circuit (110n). It is noted that the gate voltages ($V_{CASC\_1}, V_{CASC\_2}$) may bias the cascode transistors ($T_{N1}, T_{N2}$) so to protect each individual transistor from overvoltage while generating the high side reference voltage, $V_H$. Accordingly, a height of the cascode configuration (130n), or in other words, a number of the cascode transistors (e.g., $T_{N1}$), $T_{N2}$) may be based on the withstand voltage of each cascode transistor and a maximum level of the supply voltage, Vdd. It should be noted that the circuit (110n) may include NMOS, PMOS or combination thereof, and not necessarily be implemented with transistors of a particular polarity.

With reference to the prior art circuit shown in FIG. 1C, a cascode configuration (130p) is used as the floating reference generator circuit (130) described in FIG. 1A. A person skilled in the art would clearly understand that principle of operation of the cascode configuration (130p) is similar to one described above with respect to the cacode configuration (130n) of FIG. 1B when considering opposite polarity of transistors, e.g., PMOS versus NMOS. In particular, as can be seen in FIG. 1C, the cascode configuration (130p) may comprise a plurality of PMOS transistors ($T_{P1}, T_{P2}$) biased by the resistor ladder ($R_1, R_2, R_3$) to generate the low side reference voltage, $V_L$, while the high side reference voltage, $V_H$, is coupled to the supply voltage, Vdd. Accordingly, a demand current, $I_P$, may flow from the supply voltage, Vdd, to the reference ground, GND, through the LV PMOS circuit (110p) and through the cascode configuration (130p). Such demand current, $I_P$, may be responsive to operation requirements of the LV PMOS circuit (110p). It should be noted that the circuit (110p) may include NMOS, PMOS or combination thereof, and not necessarily be implemented with transistors of a particular polarity.

In implementations where the supply voltage, Vdd, varies substantially, the divided voltages at the nodes of the resistor ladder circuit (e.g., $R_1, R_2, \ldots, R_N$) may correspondingly vary, and therefore affect the floating reference voltages ($V_H$, $V_L$). For example, with reference to FIG. 2A, if a voltage division, Vdd/N, provided by the resistor ladder circuit (120) is to protect the LV circuit (110) at a maximum value of the supply voltage, Vdd, then a decrease of the supply voltage, Vdd, may correspondingly decrease the difference, $V_H$–$V_L$, and therefore reduce a dynamic range of operation of the LV circuit (110). In some cases, such reduction of the dynamic range of operation may degrade performance of the LV circuit (110) or even render the circuit inoperable. For example, with reference to FIG. 1B, the decrease of the supply voltage, Vdd, may decrease a voltage level of $V_{CASC\_2}$ provided at a common node between series-connected resistors $R_2$ and $R_3$ of the resistor ladder circuit (120), which in turn decreases a voltage level of the high side reference voltage, $V_H$, and therefore reduces a dynamic range of operation of the LV NMOS circuit (110n) since the difference voltage, $V_H$–$V_L$, is reduced.

As shown in FIG. 2A, prior art implementations attempt to overcome effect of a varying supply voltage, Vdd, over operation of the LV circuit (110) by limiting a low value of the difference, $V_H$–$V_L$, generated by the protection circuit (120, 230), and therefore maintaining a minimum dynamic range of operation of the LV circuit (110). For example, with reference back to FIG. 1B, such limiting can be with respect to the gate voltage, $V_{CASC\_2}$, provided to the cascode transistor $T_{N2}$ of the cascode configuration (130n) that sets the high side reference voltage, $V_H$. Likewise, with reference back to FIG. 1C, the limiting can be with respect to the gate voltage, $V_{CASC\_1}$, provided to the cascode transistor $T_{P1}$ of the cascode configuration (130p) that sets the low side reference voltage, $V_L$.

FIG. 2B shows a prior art implementation that limits a low value of the difference, $V_H$–$V_L$, applied to the circuit of FIG. 1B. In such prior art implementation, a comparator circuit (230n) is used to detect a voltage level of a divided voltage provided at a common node of the two series-connected resistors ($R_2$, $R_3$), compare the detected voltage level to a reference voltage level, $V_{CASC\_min}$, and based on the comparison, generate the gate voltage, $V_{CASC\_2}$, provided to the cascode transistor $T_{N2}$ of the cascode configuration (130n) that sets the high side reference voltage, $V_H$. As can be seen in FIG. 2B, the comparison is provided by a comparator, Comp, that is coupled, at its respective positive (+) and negative (−) inputs to: the divided voltage provided at a common node of the two series-connected resistors ($R_2$, $R_3$); and to the reference voltage level, $V_{CASC\_min}$, the reference voltage level based on (e.g., equal to) the low value of the difference, $V_H$–$V_L$, that is required for normal operation (e.g., dynamic range) of the LV NMOS circuit (110n).

With continued reference to FIG. 2B, at high values of the supply voltage, Vdd, the voltage level at the positive (+) input of the comparator, Comp, is greater than the reference voltage level, $V_{CASC\_min}$, at the negative (−) input of the comparator, Comp, and therefore the output of the comparator controls the switch S1 to close and the switch/S1 to open. At low values of the supply voltage, Vdd, the voltage level at the positive (+) input of the comparator, Comp, is smaller than the reference voltage level, $V_{CASC\_min}$, at the negative (−) input of the comparator, Comp, and therefore the output of the comparator controls the switch S1 to open and the switch/S1 to close. Accordingly, the comparator circuit (230n) sets a voltage level of the gate voltage, $V_{CASC\_2}$, to the greater of the divided voltage provided by the resistor ladder circuit (120) and the reference voltage level, $V_{CASC\_min}$. In other words, with reference to FIG. 3B later described, for varying levels of the supply voltage, Vdd, the gate voltage, $V_{CASC\_2}$ (likened to $V_{CASC}$ in FIG. 3B), and therefore the difference voltage, $V_H$–$V_L$, consists of two linear segments, a first linear segment (1) that is a linear function of the supply voltage, Vdd, and a second segment (2) that is a constant value. As can be clearly taken from FIG. 3B, a transition between the first and second linear segments is abrupt, that is, occurs at an intersection point of the two linear segments, each segment having a different slope. A person skilled in the art would clearly realize that a similar comparator-based circuit as the circuit (230n) described above with reference to FIG. 2B may be designed for the prior art PMOS configuration described above with reference to FIG. 1C.

Such prior art solution to overcome effects of the varying supply voltage over a dynamic range of the LV circuit via a comparator circuit (e.g., FIG. 2B) may not be suitable in implementations where a higher power supply rejection ratio (PSSR) performance of the LV circuit is required. As a voltage level of the supply voltage, Vdd, approaches the reference voltage level, $V_{CASC\_min}$, to the comparator, a noise level of the supply voltage, Vdd, can miss-trigger the comparator, and result in (random) tones over the reference voltages ($V_H$, $V_L$) which can limit the PSSR performance. Likewise, an inherent discontinuity provided by the switching voltages of the prior art comparator-based circuit can further affect the PSSR performance. Furthermore, it may be desirable to further reduce a physical footprint of the protection circuit according to the prior art by providing, for example, a solution not requiring a comparator.

Teachings according to the present disclosure describe methods and apparatuses for protection of LV circuits and devices via a cascode configuration that generates continuous (floating) reference voltages to the LV circuits and without drawbacks of the prior art implementations.

SUMMARY

According to a first aspect of the present disclosure, a protection circuit is presented, the protection circuit comprising: a resistor ladder operating between a varying supply voltage and a reference ground; and a reference generator and clamp (RGC) circuit operating between the varying supply voltage and the reference ground, the RGC circuit configured to generate a reference voltage based on a divided voltage across a resistor of the resistor ladder so that for varying values of the supply voltage, a difference voltage between the reference voltage and one of the varying supply voltage or the reference ground is greater than a minimum voltage, wherein the difference voltage is according to a nonlinear function of the varying supply voltage, comprising: a first linear segment having a first slope; a second linear segment having a second slope; and a nonlinear segment that provides a continuous and smooth transition between the first and the second linear segments.

According to second aspect of the present disclosure, a method for protecting a low voltage (LV) circuit in a high voltage (HV) domain is presented, the method comprising: implementing a protection circuit according to claim 1 in the HV domain; based on the implementing, generating a low voltage (LV) domain based on the reference voltage and the one of the varying supply voltage or the reference ground; operating the LV circuit in the LV domain; and based on the operating, protecting the LV circuit from high voltages while maintaining a dynamic range of operation of the LV circuit based on the minimum voltage of the difference voltage.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1B shows a simplified schematic of a prior art protection circuit used to protect a low voltage (LV) circuit implemented with low voltage (LV) NMOS transistors.

FIG. 1C shows a simplified schematic of a prior art protection circuit used to protect a low voltage (LV) circuit implemented with low voltage (LV) PMOS transistors.

FIG. 6A shows graphs representing simulation results of the transfer function generated by the protection circuit of FIG. 4A.

FIG. 6B shows graphs representing simulation results of the transfer function generated by the protection circuit of FIG. 5.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

Figure 1A:
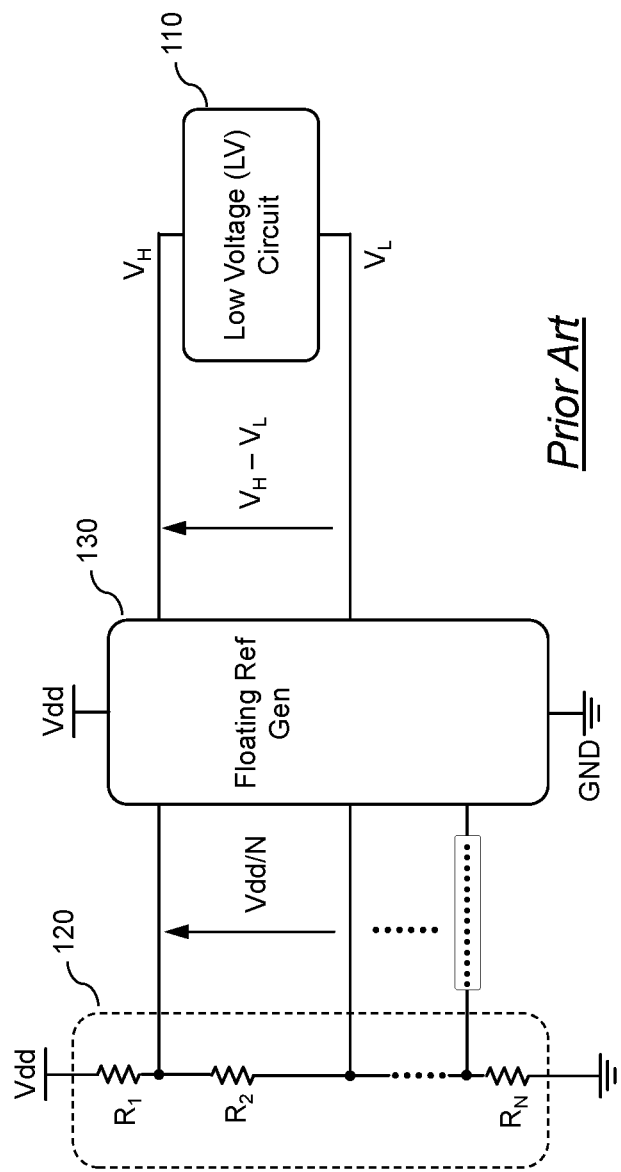
FIG. 1A shows a simplified block diagram of a prior art protection circuit used to protect a low voltage (LV) circuit.
Figure 2A:
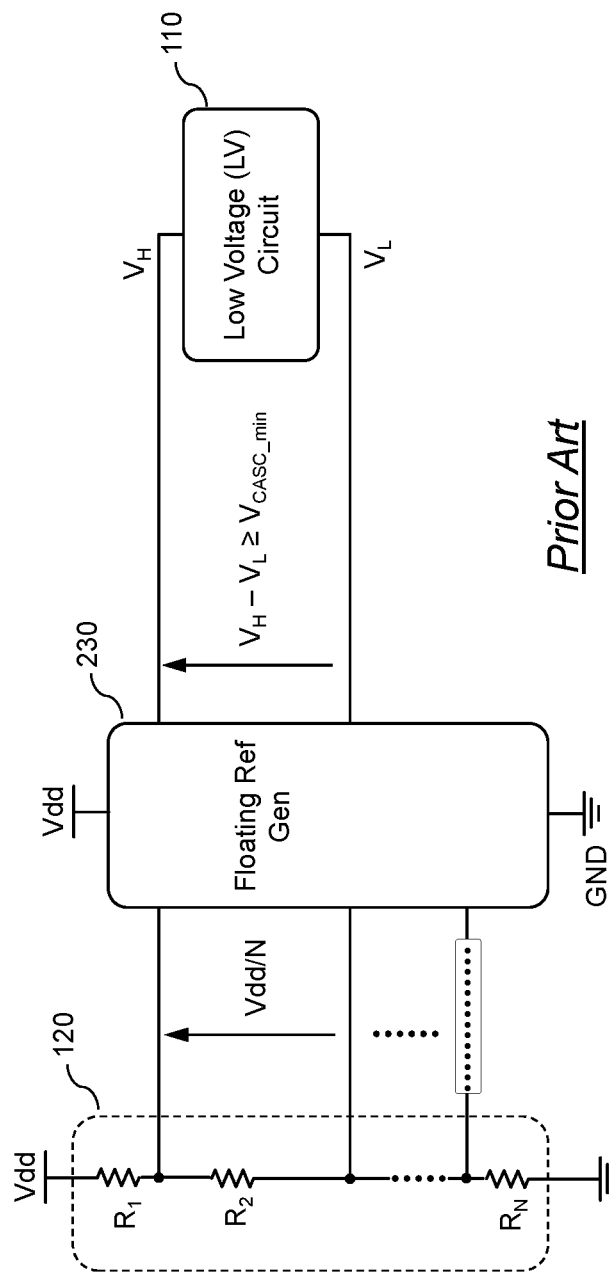
FIG. 2A shows a simplified block diagram of a prior art protection circuit used to protect a low voltage (LV) circuit over a varying supply voltage while maintaining a minimum dynamic range of operation of the LV circuit.
Figure 2B:
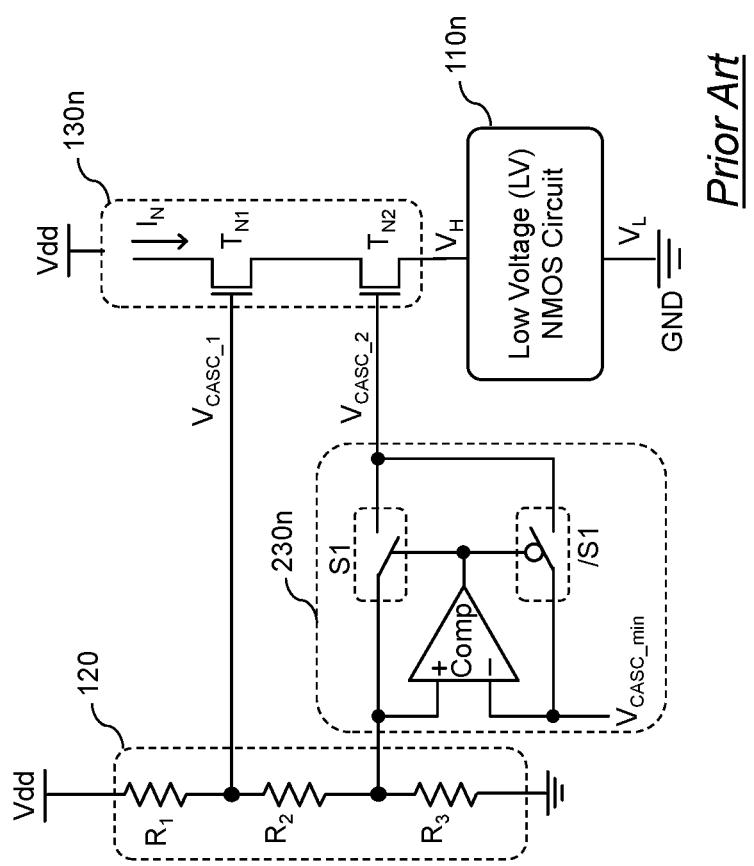
FIG. 2B shows an exemplary implementation of the prior art protection circuit of FIG. 2A using a comparator circuit.
Figure 3A:
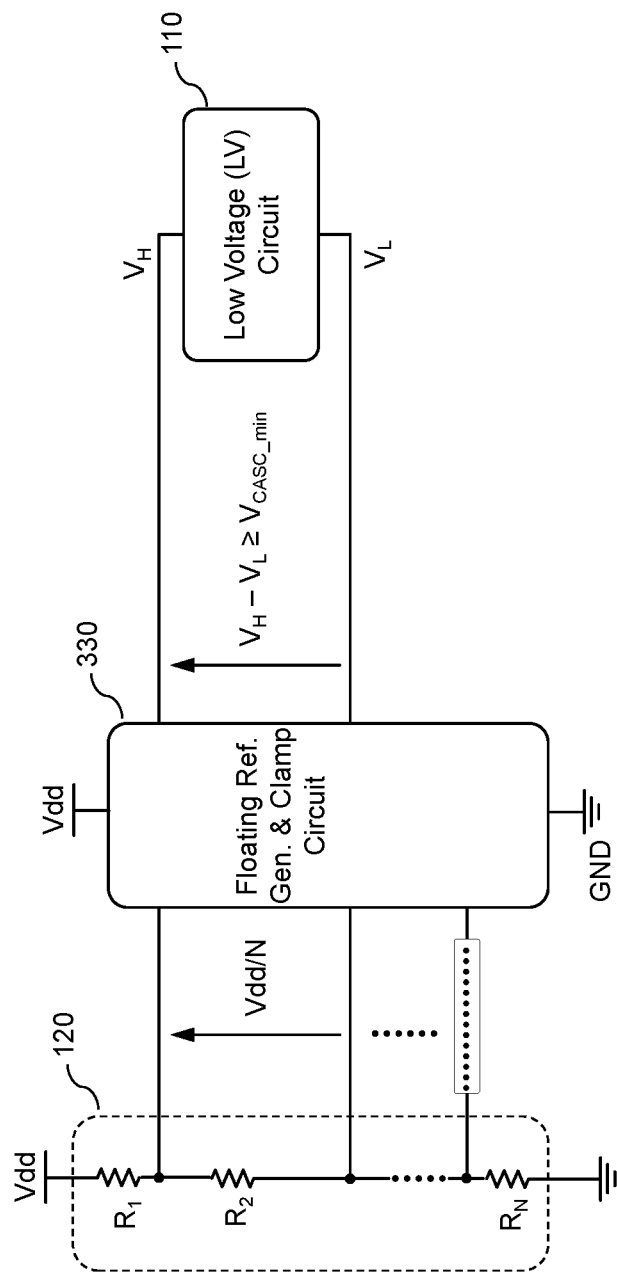
FIG. 3A shows a simplified block diagram of a protection circuit according to an embodiment of the present disclosure used to protect a low voltage (LV) circuit over a varying supply voltage while maintaining a minimum dynamic range of operation of the LV circuit.

FIG. 3A shows a simplified block diagram of a protection circuit (120, 330) according to an embodiment of the present disclosure used to protect the low voltage (LV) circuit (110) over a varying supply voltage, Vdd, while maintaining a minimum dynamic range of operation of the LV circuit (110). Similarly, to the prior art configurations described above with reference to, for example, FIG. 2A, the protection circuit (120, 330) operates over a high voltage domain defined by the varying supply voltage, Vdd, and the reference ground, GND. The dynamic range of operation of the LV circuit (110) may be based on the voltage difference, $V_H - V_L$, across the LV circuit (110), which as shown in FIG. 3A, may be maintained at a level that is greater than (or equal to) a reference voltage level, $V_{CASC\_min}$, that corresponds to operation according to the minimum dynamic range. While not indicated in FIG. 3A, it is understood that the protection circuit (120, 330) may also limit a high value of the voltage difference, $V_H - V_L$, so to protect the LV circuit (110) and corresponding one or more LV transistor devices.

With continued reference to FIG. 3A, according to an embodiment of the present disclosure, the protection circuit (120, 330) comprises a floating reference generator and clamp circuit (330) that generates the floating reference voltages ($V_H, V_L$) based on the divided supply voltage, Vdd, provided at common nodes of the resistor divider circuit (120). However, differently from the prior art protection circuit described above with reference to FIG. 2A, the floating reference generator and clamp circuit (330) does not generate any discontinuities (or abrupt changes) in the floating reference voltages ($V_H, V_L$), rather gradually clamps the voltage difference, $V_H - V_L$, to the reference voltage level, $V_{CASC\_min}$, as the voltage difference decreases towards the reference voltage level, $V_{CASC\_min}$. Accordingly, as can be seen in FIGS. 6A and 6B later described, for varying levels of the supply voltage, Vdd, a gate voltage, $V_{CASC}$, that is representative of the difference voltage, $V_H - V_L$, is a nonlinear function of the supply voltage, Vdd, which comprises two linear segments with different slopes, a first linear segment and a second linear segment (labeled as 1 and 2 in FIGS. 6A and 6B) that are linear functions of the supply voltage, Vdd, and a third segment (labeled as 3 in FIGS. 6A and 6B) that is a nonlinear function of the supply voltage, Vdd, the third segment providing a continuous and smooth transition between the first and second segments over an extended range of the supply voltage, Vdd.

Figure 3B:
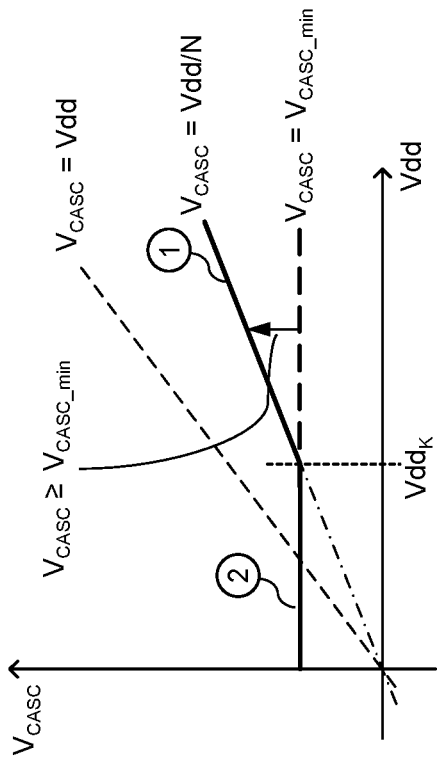
FIG. 3B shows a construct of a nonlinear transfer function between a cascode voltage generated by the protection circuit of FIG. 3A and the varying supply voltage for a case where the LV circuit is implemented with LV NMOS transistors.
Figure 4A:
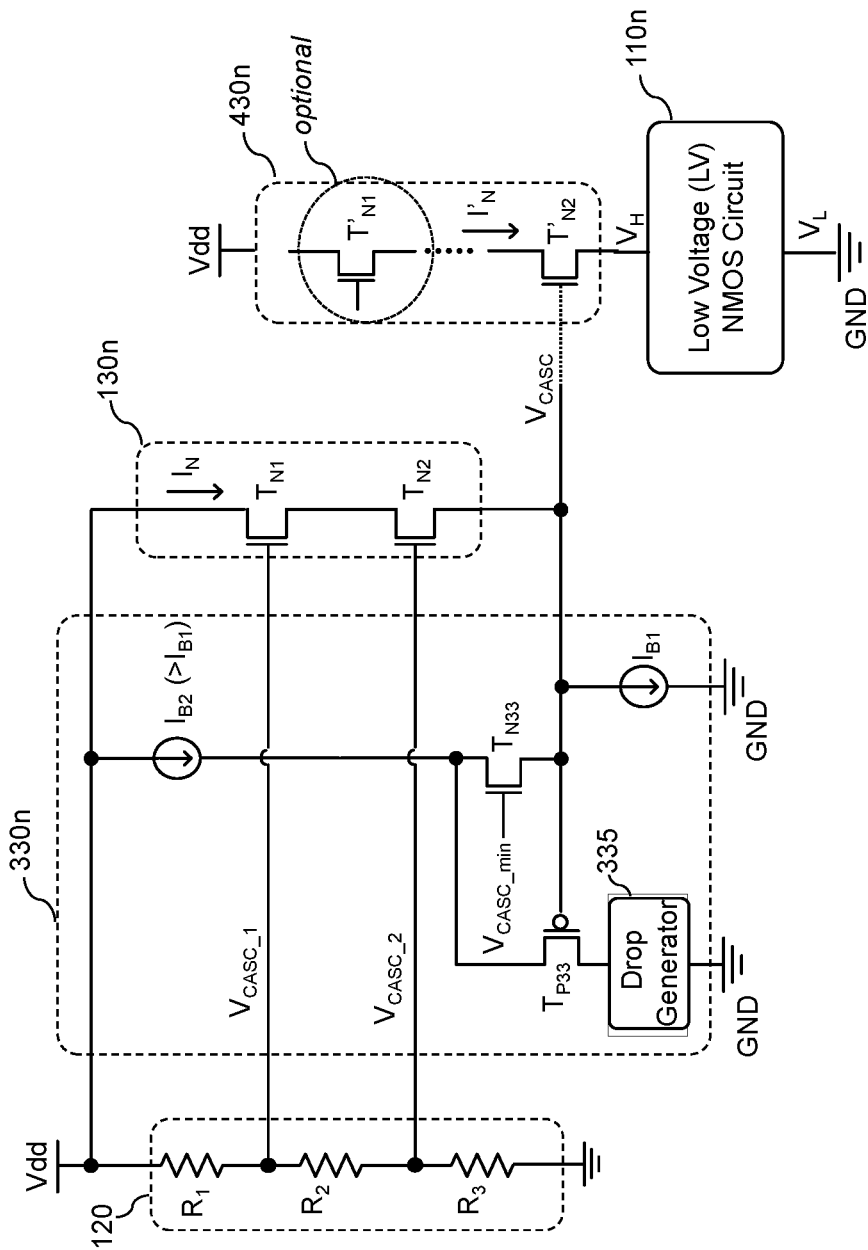
FIG. 4A shows a simplified schematic of a protection circuit according to an embodiment of the present disclosure used to generate a transfer function based on the construct of FIG. 3B to protect a low voltage (LV) circuit implemented with low voltage (LV) NMOS transistors.

FIG. 3B shows a construct of a nonlinear transfer function between a cascode voltage, $V_{CASC}$, that is representative of the difference voltage, $V_H - V_L$, generated by the protection circuit (120, 330) of FIG. 3A, and the varying supply voltage, Vdd, for a case where the LV circuit (e.g., 110 of FIG. 3A) is implemented with LV NMOS transistors (e.g. as shown in FIG. 4A later described). As can be seen in FIG. 3B, the construct, represented in solid lines, is based on two linear functions (represented in the figure via corresponding dotted lines) respectively provided by a first equation $V_{CASC} = Vdd/N$ and a second equation $V_{CASC} = V_{CASC\_min}$, lines corresponding to the first and second equations intersecting at a value of $(Vdd, V_{CASC}) = (Vdd_K, V_{CASC\_min})$. The construct of the nonlinear transfer function is provided by following, for values of $Vdd > Vdd_K$, the segment labeled as 1, and for values of $Vdd < Vdd_K$, the segment labeled as 2. In this context, the term "following" may refer to providing, for varying values of Vdd, values of $V_{CASC}$ that are substantially equal to, but not smaller than, the values provided by respective segments 1 and 2. Accordingly, as can be clearly taken from FIG. 3B, such construct can satisfy the condition $V_H-V_L \geq V_{CASC\_min}$.

As described later in the present disclosure, the floating reference generator and clamp circuit (330) of the protection circuit (120, 330) shown in FIG. 3A, generates the nonlinear function by deactivating a clamp circuit during operation in segment 1 and activating the clamp circuit during operation in segment 2, wherein as shown, for example, in FIGS. 6A and 6B, a smooth and continuous voltage transition segment 3 is obtained between segments 1 and 2. According to the various teachings of the present disclosure, depending on the polarity of the LV circuit (110), the activating the clamp circuit of the floating reference generator and clamp circuit (330) of the protection circuit (120, 300), may include clamping (i.e., limiting a minimum level) of a voltage that is based on a voltage across two nodes of the resistor ladder (120). For example, in the case of the NMOS polarity, the clamping may limit a minimum level of a voltage that is based on a voltage across the bottom resistor (e.g., $R_N$ of FIG. 3A coupled to the reference ground, GND), whereas in the case the PMOS polarity, the clamping may limit a minimum level of a voltage that is based on a voltage across the top resistor (e.g., $R_1$ of FIG. 3A coupled to the supply voltage, Vdd).

FIG. 4A shows a simplified schematic of a protection circuit (120, 130n, 330n) according to an embodiment of the present disclosure used to generate a nonlinear transfer function (e.g., as shown in FIGS. 6A) based on the construct of FIG. 3B to protect a low voltage (LV) NMOS circuit (110n) implemented with low voltage (LV) NMOS transistors. As can be seen in FIG. 4A, the protection circuit (120, 130n, 330n) generates a voltage, $V_{CASC}$, that is coupled to a gate of a cascode transistor, $T'_{N2}$, whose source, coupled to the high side of the LV NMOS circuit (110n), provides the high side floating reference voltage, $V_H$. Accordingly, assuming when conducting, the cascode transistor, $T'_{N2}$, has a gate-to-source voltage of about zero volts (e.g., threshold voltage, VTH, of about zero volts), then $V_{CASC}$ is about equal to $V_H$. It follows that for the NMOS configuration shown in FIG. 4A, the condition $V_H-V_L \geq V_{CASC\_min}$ is equivalent to $V_{CASC} \geq V_{CASC\_min}$ provided by the construct described above with reference to FIG. 3B. Furthermore, it should be noted that although the protection circuit (120, 130n, 330n) generates the voltage $V_{CASC}$ that establishes the high side floating reference voltage, $V_H$, as shown in FIG. 4A, a path for a demand current, $I'_N$, though the LV NMOS circuit (110n) may be provided by a cascode configuration (430n) that may include one or more transistors (e.g., low LV transistors $T'_{N2}$, $T'_{N1}$, . . . ), wherein a number of such transistors may be based on a withstand voltage of the transistors and a high value of a voltage across the cascode configuration (430n).

With continued reference to FIG. 4A, implementation of the construct of FIG. 3B is provided by a combination of the resistor ladder (120) coupled to the cascode configuration (130n) and a clamping circuit (330n) to provide a voltage level of $V_{CASC}$. The combination of (120, 130n) provides a voltage level of $V_{CASC}$ according to the segment 1 of the construct shown in FIG. 3B. Furthermore, the clamping circuit (330n), comprising an NMOS transistor, $T_{N33}$, whose gate is coupled to the reference voltage, $V_{CASC\_min}$, provides a voltage level of $V_{CASC}$ according to the segment 2 of the construct shown in FIG. 3B. Biasing and high voltage protection of the NMOS transistor, $T_{N33}$, is provided by a PMOS transistor follower, $T_{P33}$, whose source and gate nodes are respectively coupled/connected to the drain and source nodes of $TN_{33}$ as shown in FIG. 4A. Accordingly, a drain-to-source voltage of $T_{N33}$ is provided (and limited) by a gate-to-source voltage of $T_{P33}$. Furthermore, a drop generator circuit (335) coupled to the drain node of $T_{P33}$ is configured to generate a voltage high enough to protect $T_{P33}$ against high voltage while maintaining $T_{P33}$ in a conducting state (i.e., ON state, activated) during operation of the protection circuit (120, 130n, 330n).

With further reference to FIG. 4A, a current source, $I_{B2}$, coupled between the supply voltage, Vdd, and drain/source nodes of $T_{N33}$/$T_{P33}$, provides a current through such transistors when conducting. Furthermore, a current source, $I_{B1}$, is coupled between the source nodes of the cascode transistor, $T_{N2}$, and the transistor, $T_{N33}$, and the reference ground, GND. As will be understood by a person skilled in the art, at high values of the supply voltage, Vdd, the voltage level of $V_{CASC\_2}$ is sufficiently high so that the cascode configuration (130), and therefore the cascode transistor, $T_{N2}$, conduct, and a current, $I_N$, through the cascode configuration (130n) is set by the current source $I_{B1}$.

Figure 4B:
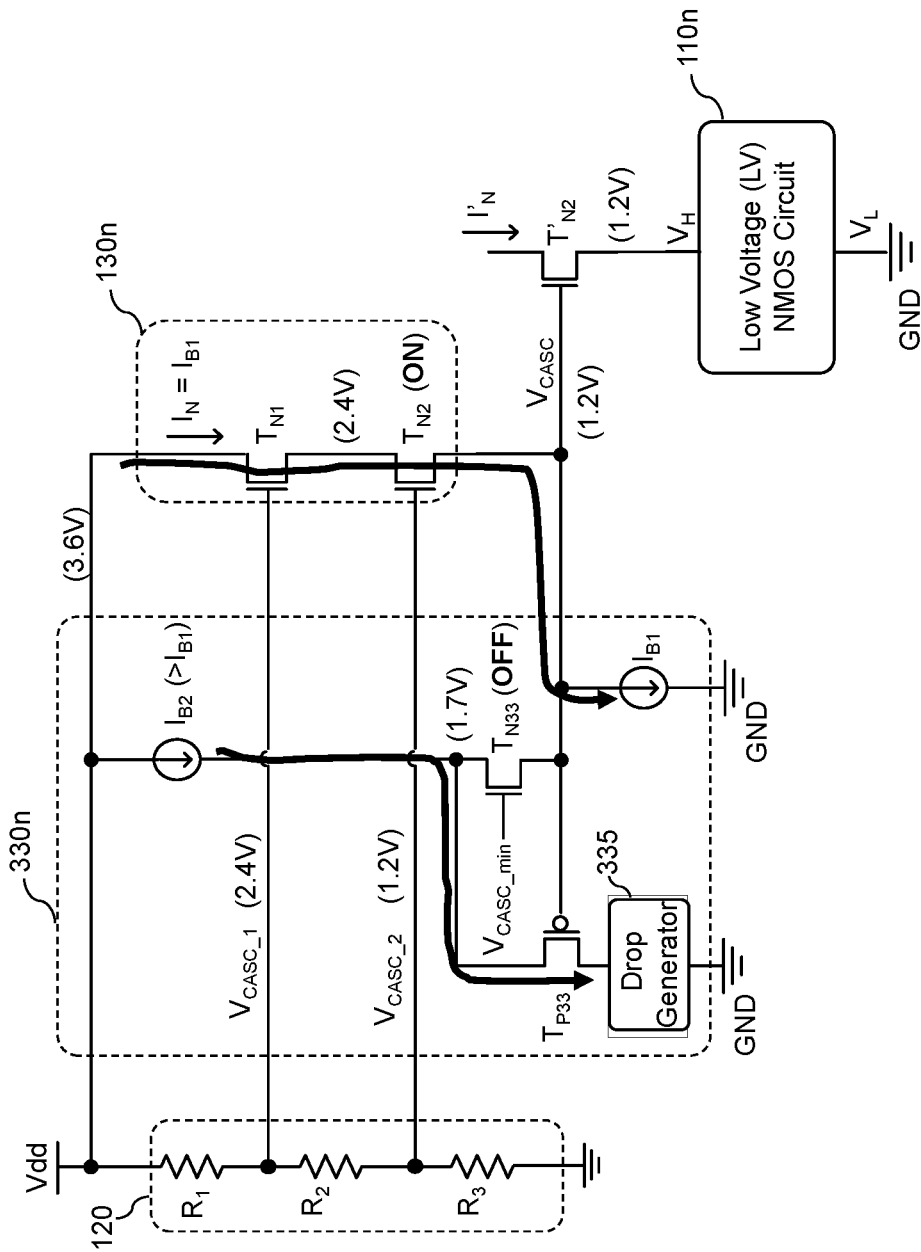
FIG. 4B shows operation of the protection circuit of FIG. 4A for generating a first segment of the transfer function.

With continued reference to FIG. 4A, for sufficiently high values of the supply voltage, Vdd, corresponding to the segment 1 shown in FIG. 3B (or FIG. 6A), the voltage level of $V_{CASC\_2}$, and therefore of $V_{CASC}$, is sufficiently high (e.g., larger than $V_{CASC\_min}$) to maintain transistor $T_{N33}$ in its OFF state (e.g., non-conduction, deactivated), and therefore the entirety of the current provided by the current source $I_{B1}$ flows through the cascode configuration (130n) and the entirety of the current provided by the current source $I_{B2}$ flows through the transistor $T_{P33}$ and the drop generator (335). In this case, the voltage $V_{CASC}$ is a linear function of the supply voltage, Vdd, per segment 1 of FIG. 3B (or FIG. 6A). FIG. 4B shows exemplary voltage levels and current flow paths during operation of the protection circuit (120, 130n, 330n) according to segment 1 for an exemplary case where the reference voltage, $V_{CASC\_min}$ is equal to 1.0 volts and a gate-to-source voltage for conducting transistor $T_{N2}$ is substantially equal to zero volts.

Figure 4C:
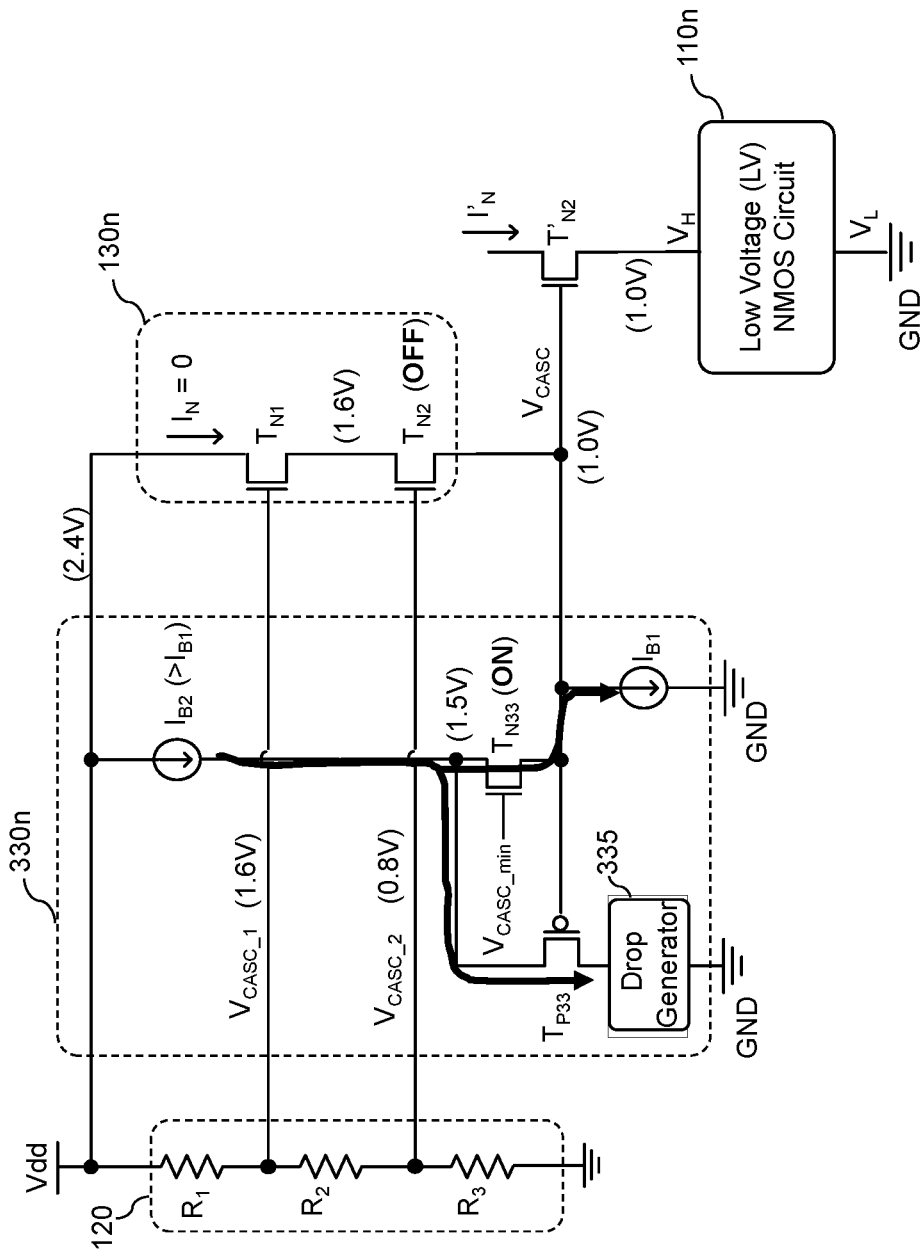
FIG. 4C shows operation of the protection circuit of FIG. 4A for generating a second segment of the transfer function.

On the other hand, for sufficiently low values of the supply voltage, Vdd, corresponding to the segment 3 shown in FIG. 3B (or FIG. 6A), the voltage level of $V_{CASC\_2}$ shown in FIG. 4A is sufficiently low (e.g., lower than $V_{CASC\_min}$) to maintain transistor $T_{N2}$ in its OFF state and transistor $T_{N33}$ in its ON state. Therefore, no current flows through the cascode configuration (130n) and the entirety of the current provided by the current source $I_{B1}$ flows through the transistor $T_{N33}$. In this case, the voltage $V_{CASC}$ is a constant value equal to the reference voltage $V_{CASC\_min}$ per segment 3 of FIG. 3B (or FIG. 6A). Since the current source $I_{B2}$ is sized to provide a current that is larger than a current provided by the current source $I_{B1}$, a difference current between the two current sources flows through the transistor $T_{P33}$ and the drop generator (335). FIG. 4C shows exemplary voltage levels and current flow paths during operation of the protection circuit (120, 130n, 330n) according to segment 3 for an exemplary case where the reference voltage, $V_{CASC\_min}$ is equal to 1.0 volts and a gate-to-source voltage for conducting transistor $T_{N33}$ is substantially equal to zero volts.

With further reference to FIG. 4A, it should be noted that the current source $I_{B2}$ is sized so that during both the ON state and the OFF state of the transistor $T_{N33}$, a current flow through the transistor $T_{P33}$ is sufficiently high to generate a voltage drop across the drop generator circuit (335) that is sufficiently high to protect the transistor $T_{P33}$ from high voltage. Furthermore, it should be noted that a person skilled in the art would know of many different designs and implementations of the drop generator circuit (335), such as, for example, a diode, a resistor, or a combination thereof.

As described above, the protection circuit (120, 130n, 330n) of FIG. 4A generates a nonlinear transfer function based on the construct shown in FIG. 3B. A graph representing simulation results of such nonlinear function is shown in FIG. 6A, including two linear segments 1 and 2, and a nonlinear segment 3 that provides a smooth and continuous voltage transition between the two linear segments 1 and 2. A person skilled in the art will clearly understand that the nonlinear segment 3 corresponds to a region of operation of the protection circuit (120, 130n, 330n) where the cascode transistor $T_{N2}$ and the transistor $T_{N33}$ are respectively gradually driven into and out of conduction, and vice versa. Accordingly, during such region of operation, both transistors $T_{N2}$ and $T_{N33}$ may conduct to some extent, or in other words, the voltage $V_{CASC}$ is generated by both of the respective circuits (120, 130n) and (330n) of the transistors $T_{N2}$ and $T_{N33}$.

With continued reference to FIG. 4A, as the supply voltage, Vdd, decreases to exit segment 1 and enter segment 3 shown in FIG. 6A, the voltage level $V_{CASC2}$ (and therefore of $V_{CASC}$) shown in FIG. 4A becomes sufficiently low (e.g., about or close to $V_{CASC\_min}$) to (gradually) cause transistor $T_{N33}$ to conduct (e.g., transit from cutoff region to triode region). Likewise, the decrease of the supply voltage, Vdd, may cause (gradual) decrease in conduction (e.g., transit from saturation region to triode region) of the transistor $T_{N2}$. Such gradual increase and decrease in conduction of the transistors $T_{N33}$ and $T_{N2}$ continues with the decreasing supply voltage, Vdd, such as to provide the nonlinear segment 3 shown in FIG. 6A. As the supply voltage, Vdd, further decreases to enter segment 2, the transistor $T_{N2}$ stops conducting (e.g., OFF state, transit to cutoff region) and the transistor $T_{N33}$ is in full conduction (i.e., ON state, transit to saturation region). In this case, the voltage $V_{CASC}$ is set by the reference voltage, $V_{CASC\_min}$, and not by the gate voltage, $V_{CASC\_2}$.

With continued reference to FIG. 4A, based on the above description and as can be clearly understood by a person skilled in the art, for large values of the supply voltage, Vdd, as represented by segment 1 of FIG. 6A, the voltage $V_{CASC}$ follows, within one gate-to-source voltage drop of the NMOS cascode transistor, $T_{N2}$, the voltage $V_{CASC\_2}$ that is generated by the voltage across the bottom resistor $R_3$ of the resistor ladder (120). Furthermore, for small values of the supply voltage, Vdd, as represented by segment 2 of FIG. 6A, the voltage $V_{CASC}$ follows, within one gate-to-source voltage drop of the NMOS cascode transistor, $T_{N33}$, the reference voltage $V_{CASC\_min}$. Finally, for values of the supply voltage, Vdd, as represented by segment 3 of FIG. 6A, the voltage $V_{CASC}$ follows the voltage $V_{CASC\_2}$ and the reference voltage $V_{CASC\_min}$ within one gate-to-source voltage drop of the respective transistors, $T_{N2}$ and $T_{N33}$.

Figure 3C:
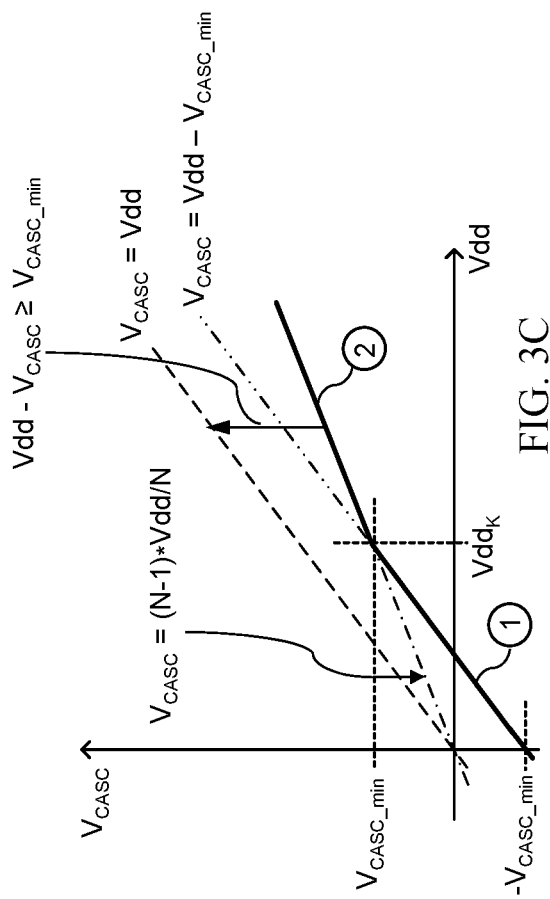
FIG. 3C shows a construct of a nonlinear transfer function between a cascode voltage generated by the protection circuit of FIG. 3A and the varying supply voltage for a case where the LV circuit is implemented with LV PMOS transistors.
Figure 5:
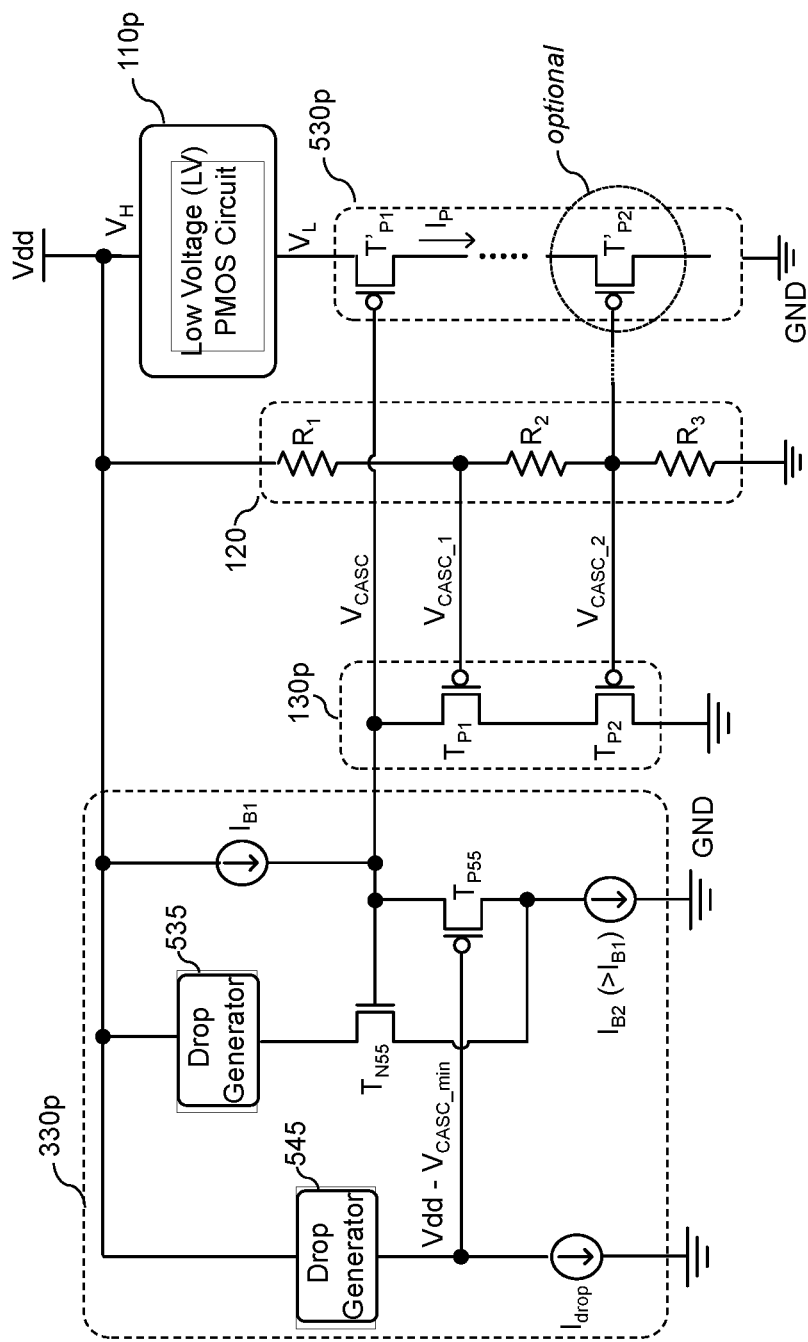
FIG. 5 shows a simplified schematic of a protection circuit according to an embodiment of the present disclosure used to generate a transfer function based on the construct of FIG. 3C to protect a low voltage (LV) circuit implemented with low voltage (LV) PMOS transistors.

FIG. 3C shows a construct of a nonlinear transfer function between a cascode voltage, $V_{CASC}$, generated by the protection circuit (120, 330) of FIG. 3A, and the varying supply voltage, Vdd, for a case where the LV circuit (e.g., 110 of FIG. 3A) is implemented with LV PMOS transistors as shown in FIG. 5. As can be seen in FIG. 3C, the construct, represented in solid lines, is based on two linear functions (represented in the figure via corresponding dotted lines) respectively provided by a first equation $V_{CASC}=(N-1)*Vdd/N$ and a second equation $V_{CASC}=Vdd-V_{CASC\_min}$, lines corresponding to the first and second equations intersecting at a value of (Vdd, $V_{CASC}$)=($Vdd_K$, $V_{CASC\_min}$). The construct of the nonlinear transfer function is provided by following, for values of Vdd<$Vdd_K$, the segment labeled as 1, and for values of Vdd>$Vdd_K$, the segment labeled as 2. In this context, the term "following" may refer to providing, for varying values of Vdd, values of $V_{CASC}$ that are substantially equal to, but not smaller than, the values provided by respective segments 1 and 2. Accordingly, as can be clearly taken from FIG. 3C, such construct can satisfy the condition $Vdd-V_{CASC}=V_H-V_L \geq V_{CASC\_min}$. A person skilled in the art would realize differences between the constructs of FIG. 3B and FIG. 3C. In particular, for the construct of FIG. 3B, the Vcasc voltage decreases as Vdd decreases until it reaches a minimum level, $V_{CASC\_min}$, that is acceptable for the circuit at its output (e.g., 110n of FIG. 4A). The Vcasc voltage is then clamped to Vcasc_min. In contrast, for the construct of FIG. 3C, the Vcasc voltage follows a divided voltage level of the varying supply voltage, Vdd, at high values of Vdd, and follows Vdd-Vcasc_min at low values of Vdd. In other words, in the construct represented by FIG. 3C, Vcasc does not clamp at a fixed voltage value as in the function represented by FIG. 3B, but rather at a fixed offset value with respect to Vdd.

With reference to FIGS. 3C, 5 and 6B, it should be clear to a person skilled in the art that such figures are mere embodiments according to the present disclosure equivalent to the embodiments described above respectively with reference to FIGS. 3B, 4A and 6A, but for a case of an opposite polarity, PMOS versus NMOS, of the low voltage circuit to be protected. Accordingly, the protection circuit (120, 130p, 330p) shown in FIG. 5 can be derived from the protection circuit (120, 130n, 330n) of FIG. 4A by replacing NMOS devices (e.g., labeled as $T_{Nij}$) with PMOS devices (e.g., labeled as $T_{Pij}$) and vice versa. Furthermore, because the nonlinear function (e.g., FIG. 6B) generated by the protection circuit (120, 130n, 330n) of the PMOS configuration shown in FIG. 5 should satisfy the condition $Vdd-V_{CASC}=V_H-V_L \geq V_{CASC\_min}$, and therefore $Vdd-V_{CASC\_min} \geq V_{CASC}$, then a reference (high) voltage level used by the clamp circuit (330p) may be equal to $Vdd-V_{CASC\_min}$ (instead of $V_{CASC\_min}$ of the NMOS configuration of FIG. 4A) As shown in FIG. 5, such reference voltage level can be provided via a series-connected combination of an additional drop generator (545) and an additional current source, Idrop, to generate a voltage drop equal to $V_{CASC\_min}$ across the drop generator (545).

As known to a person skilled in the art, FET devices, such as the NMOS and PMOS devices used in the various implementations according to the present disclosure described above with reference to, for example, FIG. 4A and FIG. 5, may have a non-zero threshold voltage, VTH, of about zero volt.

As previously described, one or more of the transistors used in the various implementations above with reference to, for example, FIG. 4A and FIG. 5, may be selected to have no voltage drop between respective gate and source nodes (e.g., threshold voltage, $V_{TH}$, of about zero volts) when conducting, so that protection of the LV circuit, including clamping of the difference voltage, $V_H-V_L$, may be provided based on the true values of the divided voltages provided by nodes of the resistor ladder (120) to the gates of the transistors of the cascode configuration (e.g., (130n) of FIG. 4A and (130p) of FIG. 5). However, teachings according to the present disclosure may equally be implemented with transistors having non-zero threshold voltage, $V_{TH}$, and which therefore incur a gate-to-source voltage drop which may translate to an offset voltage in the protection circuit (e.g., offset in $V_{CASC}$ of FIGS. 4A and 5). Such implementations may be provided via addition of compensating circuits to compensate for the voltage drops and therefore the offset voltage.

According to one exemplary embodiment of the present disclosure, the compensating may be built in the resistor ladder (e.g., (120) of FIGS. 4A, 5) by selecting the resistors values (e.g., $R_1$, $R_2$, $R_3$ of FIGS. 4A, 5) such as to generate divided voltages (e.g., $V_{CASC\_1}$, $V_{CASC\_2}$ of FIGS. 4A, 5) at the nodes of the resistor ladder (120) that are offset (e.g., higher) by respective voltage drops (e.g., one $V_{TH}$) of the transistors (e.g., (130n) of FIG. 4A, (130p) of FIG. 5) whose gates are coupled to the resistor ladder (120).

According to another exemplary embodiment of the present disclosure, the compensating may be provided by complementary transistors (e.g., opposite polarity and of same characteristics) to the transistors of the protection circuit whose voltage drops are to be compensated. This allows to generate, via the complementary transistors, voltage drops of opposite sign that track (e.g., over process and temperature variations) the voltage drops of the transistors used in the protection circuit, and therefore, when combined, can compensate for the voltage drops and therefore null the offset voltage.

Figure 7C:
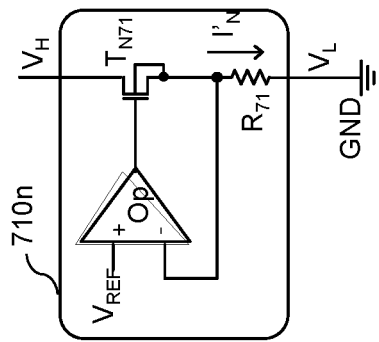
FIG. 7C shows an exemplary LV circuit implemented with LV NMOS transistors.
Figure 7B:
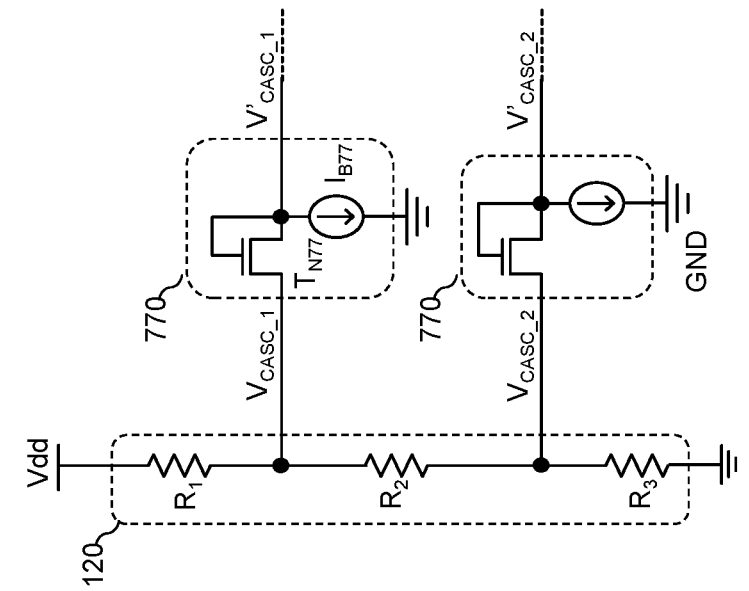
FIG. 7B shows another exemplary circuit for compensating a threshold voltage (Vth) drop of cascode transistors used in a protection circuit according to the present disclosure.
Figure 7A:
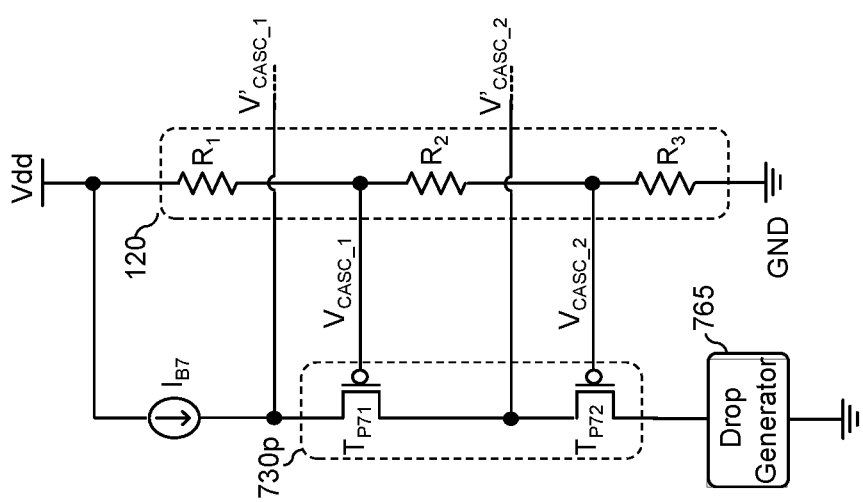
FIG. 7A shows an exemplary circuit for compensating a threshold voltage (Vth) drop of cascode transistors used in a protection circuit according to the present disclosure.

A compensation circuit ($I_{B7}$, 730p, 765) according to an exemplary embodiment of the present disclosure using complementary transistors is shown in FIG. 7A. As can be seen in FIG. 7A, the compensation circuit ($I_{B7}$, 730p, 765) comprises complementary PMOS transistors ($T_{P71}$, $T_{P72}$) arranged as a PMOS cascode configuration (730p) that is biased via a current source, $I_{B7}$, and a drop generator circuit (765). In combination, the current source, $I_{B7}$, coupled at a high side of the cascode configuration (730p), and the drop generator circuit (765) coupled at a low side of the cascode configuration (730p), maintain conduction of the complementary PMOS transistors ($T_{P71}$, $T_{P72}$) for varying levels of the supply voltage, Vdd. As shown in FIG. 7A, gate nodes of the complementary PMOS transistors ($T_{P71}$, $T_{P72}$) are coupled to respective nodes of the resistor ladder (120) that generate the voltages ($V_{CASC\_1}$, $V_{CASC\_2}$). Accordingly, voltages ($V'_{CASC\_1}$, $V'_{CASC\_2}$) at respective source nodes of the complementary PMOS transistors ($T_{P71}$, $T_{P72}$) are within one gate-to-source voltage drop of the voltages ($V_{CASC\_1}$, $V_{CASC\_2}$). In other words, the compensation circuit ($I_{B7}$, 730p, 765) level shifts the voltages ($V_{CASC\_1}$, $V_{CASC\_2}$) to provide the level shifted voltages ($V'_{CASC\_1}$, $V'_{CASC\_2}$). It follows, that by using such compensation circuit ($I_{B7}$, 730p, 765) in the protection circuit shown in FIG. 4A to protect the LV NMOS circuit (110n), and therefore replacing the cascode voltages ($V_{CASC\_1}$, $V_{CASC\_2}$) shown in FIG. 4A with the compensated cascode voltages ($V'_{CASC\_1}$, $V'_{CASC\_2}$) generated by the compensation circuit, the voltage $V_{CASC}$ shown in FIG. 4A may be equal to the voltage at the common node between resistors $R_2$ and $R_3$ of the resistor ladder (120).

A compensation circuit (770, 770) according to yet another exemplary embodiment of the present disclosure that does not use complementary transistors is shown in FIG. 7B. Although the compensation circuit (770, 770) operates in a similar manner as one described in FIG. 7A by level shifting the voltages ($V_{CASC\_1}$, $V_{CASC\_2}$) to provide the level shifted voltages ($V'_{CASC\_1}$, $V'_{CASC\_2}$). As can be seen in FIG. 7B, the level shifting is provided by similar circuits (770) coupled to nodes of the resistor ladder (120), wherein each circuit (770) comprises a diode-connected NMOS transistor, TN77, coupled to a current source, $I_{B77}$. It should be noted that the configurations shown in FIGS. 7A-7C represent exemplary nonlimiting circuits to increase the voltages coming out of the resistive divider (e.g., $R_1$, $R_2$, $R_3$ of FIG. 4A or FIG. 5) by one VGS voltage to compensate for a subsequent VGS drop (e.g., in circuits 330n of FIG. 4A or 330p of FIG. 5). A person skilled in the art would know of other configurations to provide similar compensation, such as, for example, adding a diode connected device to the bottom of the resistive divider stack.

As described above, the protection circuit according to the present disclosure may operate in a high voltage domain (e.g., Vdd, GND) and generate floating reference voltages ($V_H$, $V_L$) to an LV circuit (110) based on a voltage generated across a resistor of a resistor ladder (e.g., 120). FIG. 7C shows an exemplary nonlimiting LV circuit (710n) including a low voltage (LV) NMOS transistor $T_{N71}$ that is in series connection with a resistor $R_{71}$, the transistor and the resistor in series connection between the floating reference voltages $V_H$ and $V_L$. As can be clearly understood by a person skilled in the art, a current, $I'_N$, through the transistor $T_{N71}$ may be controlled by a reference voltage, $V_{REF}$, provided to an operational amplifier, Op, coupled to a gate of the transistor $T_{N71}$. Protection of the LV NMOS circuit (710n) may be provided by the protection circuit described above with reference to FIG. 4A. Accordingly, such protection circuit may protect the LV NMOS transistor $T_{N71}$ from high voltage (e.g., high voltage values of the supply voltage Vdd with respect to a withstand voltage of he the transistor), while maintaining a dynamic range of operation of the LV NMOS circuit, as provided, for example, by a voltage drop across the resistor $R_{71}$. It should be noted that the LV NMOS transistor $T_{N71}$ of the exemplary LV circuit (710n) may have a body-tied configuration as shown in FIG. 7C. As it would be clear to a person skilled in the art, teachings according to the present disclosure may apply to any transistor configuration (e.g., body-tied or not, zero $V_{TH}$ or not, N or P polarities, etc.) and technologies (e.g., FET, bipolar, etc.), whether used in the protection circuit or in the LV circuit, and therefore the exemplary configurations and types used in the present description with reference to the various figures should not be considered as limiting the scope of the present teachings.

Figure 8:
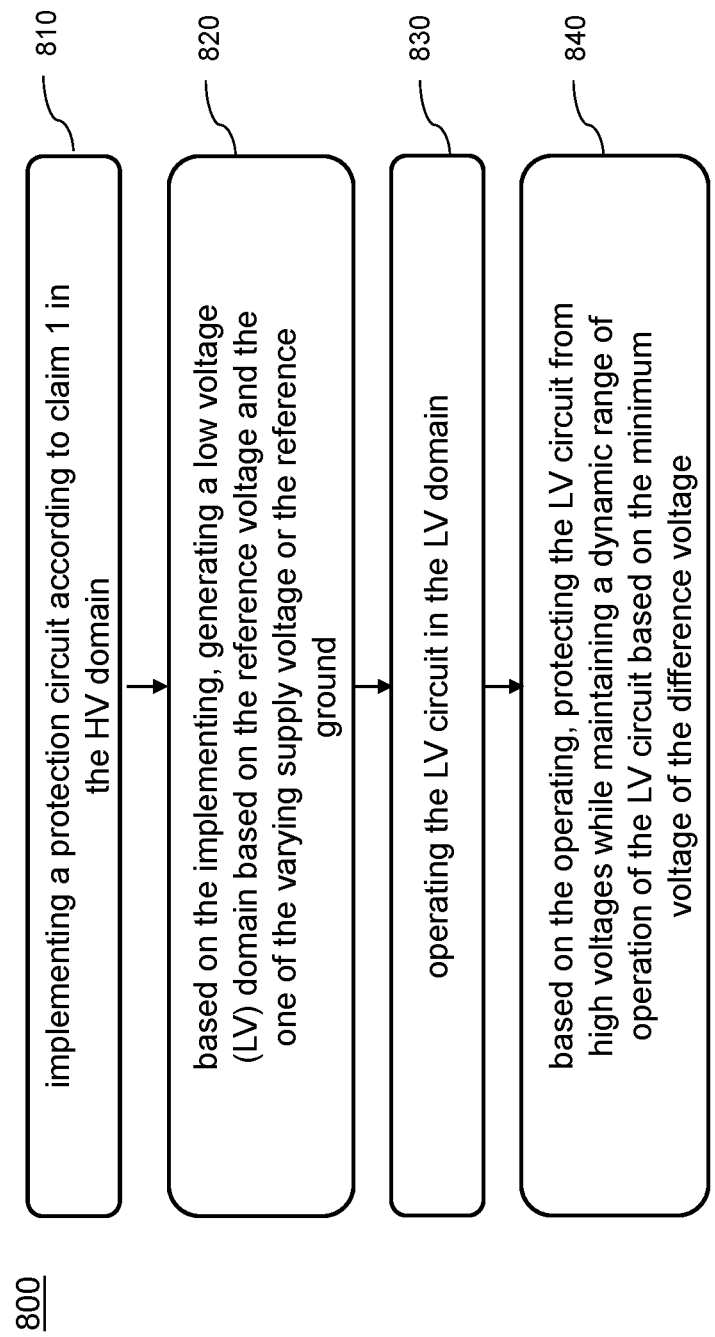
FIG. 8 is a process chart showing various steps of a method for protecting a low voltage (LV) circuit in a high voltage (HV) domain.

FIG. 8 is a process chart (800) showing various steps of a method for protecting a low voltage (LV) circuit in a high voltage (HV) domain. As can be seen in FIG. 8, such steps comprise: implementing a protection circuit according to claim 1 in the HV domain, per step (810); based on the implementing, generating a low voltage (LV) domain based on the reference voltage and the one of the varying supply voltage or the reference ground, per step (820); operating the LV circuit in the LV domain, per step (830); and based on the operating, protecting the LV circuit from high voltages while maintaining a dynamic range of operation of the LV circuit based on the minimum voltage of the difference voltage, per step (840).

It should be noted that the various embodiments of the protection circuit according to the present disclosure, including a low voltage circuit to be protected, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", U.S. Pat. No. 7,123,898, issued on Oct. 17, 2006, entitled "Switch Circuit and Method of Switching Radio Frequency Signals", U.S. Pat. No. 7,890,891, issued on Feb. 15, 2011, entitled "Method and Apparatus Improving Gate Oxide Reliability by Controlling Accumulated Charge", and U.S. Pat. No. 8,742,502, issued on Jun. 3, 2014, entitled "Method and Apparatus for use in Improving Linearity of MOSFETs Using an Accumulated Charge Sink—Harmonic Wrinkle Reduction", the disclosures of which are incorporated herein by reference in their entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A protection circuit, comprising:
    a resistor ladder operating between a varying supply voltage and a reference ground; and
    a reference generator and clamp (RGC) circuit operating between the varying supply voltage and the reference ground, the RGC circuit configured to generate a reference voltage based on a divided voltage across a resistor of the resistor ladder so that, for varying values of the supply voltage, a difference voltage between the reference voltage and one of the varying supply voltage or the reference ground is greater than a minimum voltage,
    wherein the difference voltage is according to a nonlinear function of the varying supply voltage, comprising:
        a first linear segment having a first slope;
        a second linear segment having a second slope; and
        a nonlinear segment that provides a continuous and smooth transition between the first and the second linear segments.

2. The protection circuit according to claim 1, wherein the RGC circuit comprises:
    a cascode configuration in series connection with a first current source, the cascode configuration coupled to the resistor ladder for provision of the divided voltage; and
    a clamp circuit comprising a reference transistor in series connection with the first current source and a second current source, a gate node of the reference transistor coupled to the minimum voltage, and
    the first linear segment is provided via a conduction of the cascode configuration and non-conduction of the reference transistor, and the second linear segment is provided via a conduction of the reference transistor and non-conduction of the cascode configuration.

3. The protection circuit according to claim 2, wherein the conduction of the cascode configuration is based on a flow of a current provided by the first current source through the cascode configuration, and
the conduction of the reference transistor is based on a flow of a current provided by the second current source through the reference transistor.

4. The protection circuit according to claim 2, wherein the conduction of the cascode configuration is based on a flow of an entirety of a current provided by the first current source through the cascode configuration, and
the conduction of the reference transistor is based on a flow of a portion of a current provided by the second current source through the reference transistor.

5. The protection circuit according to claim 2, wherein the nonlinear segment is provided via a conduction of the cascode configuration and conduction of the reference transistor.

6. The protection circuit according to claim 5, wherein the conduction of the cascode configuration is based on a flow of a portion of a current provided by the first current source through the cascode configuration, and
the conduction of the reference transistor is based on a flow of a remaining portion of the current provided by the first current source through the reference transistor.

7. The protection circuit according to claim 5, wherein the clamp circuit further comprises a clamping transistor coupled to the reference transistor, and
the clamping transistor is configured to limit a high voltage across the reference transistor.

8. The protection circuit according to claim 7, wherein the clamp circuit further comprises a drop generator circuit in series-connection with the clamping transistor,
the drop generator circuit is configured to generate a voltage drop that is sufficiently high to limit a high voltage across the clamping transistor while maintaining the clamping transistor in conduction.

9. The protection circuit according to claim 8, wherein a conduction of the clamping transistor is based on a flow of a remaining portion of current provided by the second current source through the clamping transistor and through the drop generator circuit, the remaining portion based on a current provided by the second current source that flows to the first current source through the reference transistor during conduction of the reference transistor.

10. The protection circuit according to claim 8, wherein the reference voltage is provided at a node coupled to:
a source node of a first cascode transistor of the cascode configuration,
a source node of the reference transistor, and
the first current source, and
a polarity of the reference transistor is same as a polarity of the first cascode transistor.

11. The protection circuit according to claim 10, wherein a source node of the reference transistor is coupled to a gate node of the clamping transistor,
a drain node of the reference transistor is coupled to a source node of the clamping transistor and to the second current source,
a drain node of the clamping transistor is coupled to the drop generator circuit, and the polarity of the reference transistor is opposite a polarity of the clamping transistor.

12. The protection circuit according to claim 11, wherein the cascode configuration comprises a plurality of series connected cascode transistors arranged in sequence from the first cascode transistor to a last cascode transistor,
the resistor ladder comprises a plurality of series connected resistors comprising a first resistor coupled to the reference ground and a last resistor coupled to the varying supply voltage, the plurality of series connected resistors forming nodes of the resistor ladder, and
gate nodes of the plurality of series connected cascode transistors are coupled to respective nodes of the resistor ladder.

13. The protection circuit according to claim 12, wherein the polarity of the first cascode transistor is N-type,
the last cascode transistor is coupled to the varying supply voltage,
the divided voltage is provided across the first resistor, the first resistor coupled to a gate node of the first cascode transistor, and
the minimum voltage is a fixed voltage.

14. The protection circuit according to claim 12, wherein the polarity of the first cascode transistor is P-type,
the last cascode transistor is coupled to the reference ground,
the divided voltage is provided across the last resistor, the last resistor coupled to a gate node of the first cascode transistor, and
the minimum voltage is a function of the varying supply voltage.

15. The protection circuit according to claim 14, wherein the minimum voltage is based on a voltage drop through a drop generator circuit coupled between the varying supply voltage and a current source.

16. A circuit, comprising:
a low voltage (LV) circuit implemented with one or more LV transistors, the low voltage circuit configured for operation in a low voltage domain; and
the protection circuit according to claim 13,
wherein the protection circuit is configured for operation over a high voltage domain defined by the varying supply voltage and the reference ground and generate therefrom, the low voltage domain defined by the reference voltage and the reference ground.

17. The circuit according to claim 16, further comprising an N-type transistor,
wherein
a gate node of said N-type transistor is coupled to the reference voltage,
a source node of said N-type transistor is coupled to the LV circuit, and
a drain node of said N-type transistor is coupled to the varying supply voltage.

18. A circuit, comprising:
a low voltage (LV) circuit implemented with one or more low voltage transistors, the low voltage circuit configured for operation in a low voltage domain; and
the protection circuit according to claim 14,
wherein protection circuit is configured for operation over a high voltage domain defined by the varying supply voltage and the reference ground and generate therefrom, the low voltage domain defined by the varying supply voltage and the reference voltage.

19. The circuit according to claim 18, further comprising a P-type transistor,
  wherein
    a gate node of said P-type transistor is coupled to the reference voltage,
    a source node of said P-type transistor is coupled to the LV circuit, and
    a drain node of said P-type transistor is coupled to the reference ground.

20. A monolithically integrated circuit comprising:
  a protection circuit according to claim 1 that is monolithically integrated.

21. The monolithically integrated circuit of claim 20, wherein the circuit is monolithically integrated by using a fabrication technology comprising one of: a) silicon-on-insulator (SOI) technology, and b) silicon-on-sapphire technology (SOS).

22. An electronic module comprising the monolithically integrated circuit according to claim 20.

23. A method for protecting a low voltage (LV) circuit in a high voltage (HV) domain, the method comprising:
  implementing a protection circuit according to claim 1 in the HV domain;
  based on the implementing, generating a low voltage (LV) domain based on the reference voltage and the one of the varying supply voltage or the reference ground;
  operating the LV circuit in the LV domain; and
  based on the operating, protecting the LV circuit from high voltages while maintaining a dynamic range of operation of the LV circuit based on the minimum voltage of the difference voltage.

* * * * *